United States Patent
Okamoto et al.

(10) Patent No.: US 11,735,435 B2
(45) Date of Patent: Aug. 22, 2023

(54) QUAD FLAT NO LEAD PACKAGE AND METHOD OF MAKING

(71) Applicant: TEXAS INSTRUMENTS INCORPORATED, Dallas, TX (US)

(72) Inventors: Dan Okamoto, Oita (JP); Hiroyuki Sada, Oita (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 239 days.

(21) Appl. No.: 16/853,186

(22) Filed: Apr. 20, 2020

(65) Prior Publication Data

US 2020/0251352 A1   Aug. 6, 2020

Related U.S. Application Data

(62) Division of application No. 14/301,942, filed on Jun. 11, 2014, now Pat. No. 10,665,475.

(51) Int. Cl.
| | |
|---|---|
| *H01L 21/56* | (2006.01) |
| *H01L 23/498* | (2006.01) |
| *H01L 23/495* | (2006.01) |
| *H01L 23/00* | (2006.01) |

(Continued)

(52) U.S. Cl.
CPC ........ *H01L 21/561* (2013.01); *H01L 23/3157* (2013.01); *H01L 23/49541* (2013.01); *H01L 23/49805* (2013.01); *H01L 23/49861* (2013.01); *H01L 24/97* (2013.01); *H01L 23/3107* (2013.01); *H01L 23/5389* (2013.01); *H01L 2224/48091* (2013.01); *H01L 2224/48247* (2013.01); *H01L 2224/97* (2013.01);

(Continued)

(58) Field of Classification Search
CPC ............ H01L 24/97; H01L 23/49861; H01L 23/3157; H01L 21/561; H01L 21/78
See application file for complete search history.

(56) References Cited

U.S. PATENT DOCUMENTS

| | | |
|---|---|---|
| 5,620,928 A | 4/1997 | Lee et al. |
| 5,652,461 A | 7/1997 | Ootsuki et al. |
| 5,696,666 A | 12/1997 | Miles et al. |

(Continued)

OTHER PUBLICATIONS

Campo, Epoxy. (2008). https://www.sciencedirect.com/topics/materials-science/epoxy (Year: 2008).*

*Primary Examiner* — Dale E Page
*Assistant Examiner* — Abbigale A Boyle
(74) *Attorney, Agent, or Firm* — Ronald O. Neerings; Frank D. Cimino

(57) ABSTRACT

A quad flat no lead ("QFN") package that includes a die having an active side positioned substantially in a first plane and a backside positioned substantially in a second plane parallel to the first plane; a plurality of separate conductive pads each having a first side positioned substantially in the first plane and a second side positioned substantially in the second plane; and mold compound positioned between the first and second planes in voids between the conductive pads and the dies. Also a method of producing a plurality of QFN packages includes forming a strip of plastic material having embedded therein a plurality of dies and a plurality of conductive pads that are wire bonded to the dies and singulating the strip into a plurality of QFN packages by cutting through only the plastic material.

20 Claims, 10 Drawing Sheets

(51) Int. Cl.
*H01L 23/31* (2006.01)
*H01L 23/538* (2006.01)

(52) U.S. Cl.
CPC ............... *H01L 2924/181* (2013.01); *H01L 2924/18165* (2013.01)

(56) References Cited

U.S. PATENT DOCUMENTS

| | | | | |
|---|---|---|---|---|
| 6,001,671 | A * | 12/1999 | Fjelstad | H01L 21/568 438/126 |
| 6,247,229 | B1 | 6/2001 | Glenn | |
| 6,294,100 | B1 * | 9/2001 | Fan | H01L 23/49541 438/754 |
| 6,498,393 | B2 * | 12/2002 | Fujimoto | H01L 21/4832 257/692 |
| 6,528,893 | B2 * | 3/2003 | Jung | H01L 23/3107 257/E23.068 |
| 6,555,906 | B2 | 4/2003 | Steven et al. | |
| 6,861,295 | B2 * | 3/2005 | Jung | H01L 24/48 438/126 |
| 7,135,781 | B2 | 11/2006 | Kalidas et al. | |
| 7,923,846 | B2 * | 4/2011 | Do | H01L 23/49548 257/E23.087 |
| 8,354,739 | B2 * | 1/2013 | Su | H01L 23/49541 438/111 |
| 8,384,228 | B1 | 2/2013 | Bartlow et al. | |
| 2002/0137263 | A1 | 9/2002 | Towle et al. | |
| 2003/0045032 | A1 * | 3/2003 | Abe | H01L 23/3107 438/123 |
| 2003/0082854 | A1 * | 5/2003 | Kasahara | H01L 24/97 438/111 |
| 2003/0104653 | A1 | 6/2003 | Farnworth | |
| 2008/0017957 | A1 | 1/2008 | Do et al. | |
| 2008/0272477 | A1 | 11/2008 | Do et al. | |
| 2009/0087946 | A1 * | 4/2009 | Masumoto | H01L 23/3107 438/107 |
| 2009/0243071 | A1 | 10/2009 | Ha et al. | |
| 2010/0052131 | A1 | 3/2010 | Tay et al. | |
| 2010/0127367 | A1 | 5/2010 | Chou | |
| 2011/0127661 | A1 | 6/2011 | Camacho et al. | |
| 2012/0119388 | A1 | 5/2012 | Cho et al. | |
| 2012/0217643 | A1 | 8/2012 | Pagaila et al. | |
| 2013/0320515 | A1 * | 12/2013 | Viswanathan | H01L 23/49568 257/676 |

* cited by examiner

QUAD FLAT NO LEAD PACKAGE AND METHOD OF MAKING

CLAIM OF PRIORITY

This application is a divisional of and claims priority to U.S. patent application Ser. No. 14/301,942 filed on Jun. 11, 2014, the entirety of which is incorporated herein by reference.

BACKGROUND

Accompanying the popularization of cell phones, notebook personal computers, and other small electronic devices has been a great demand to reduce the size and thickness of the semiconductor devices carried in them. Together with BGA (Ball Grid Array) packages and SON (Small Outline Non-leaded) packages, QFN (Quad Flat No lead) packages have become a popular configuration for small integrated circuit ("IC") packages with leadframes.

In QFN package formation, a leadframe strip containing multiple connected leadframes has multiple semiconductor dies mounted on it. This assembly is sealed with mold compound resins. Singulation is performed on this assembly with a dicing device to form individual packages. The dicing device has a rotating blade, and, by moving the blade along preset cutting line, leads exposed on the bottom surface of the package and the resin are cut simultaneously.

DETAILED DESCRIPTION

Figure 18:
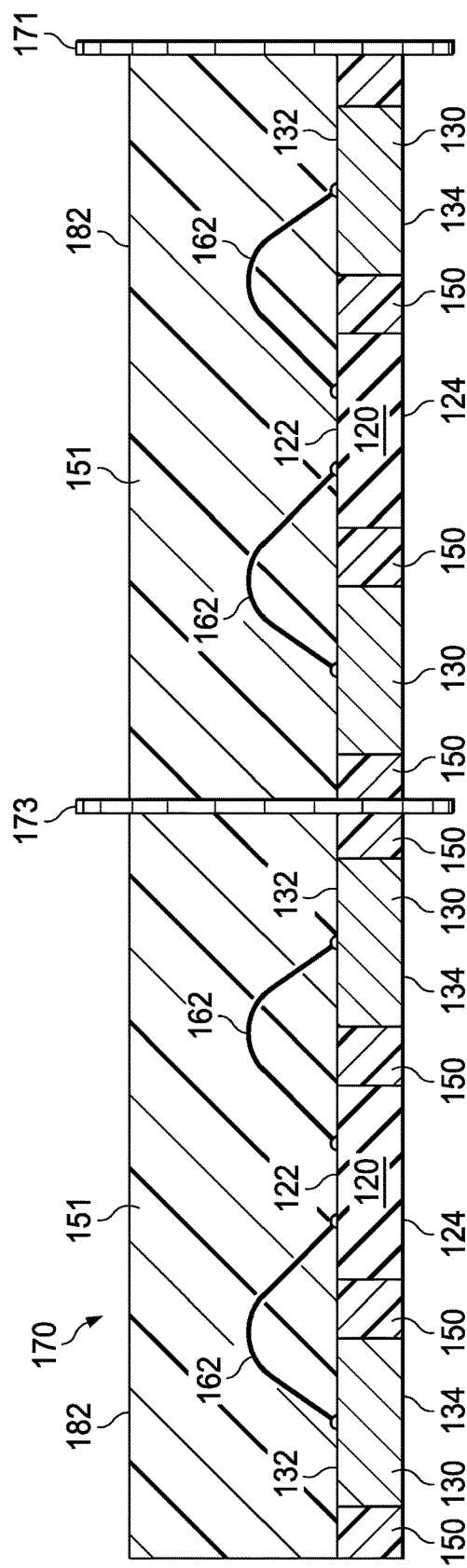
FIG. 18 shows the assembly of FIG. 17 being diced (singulated).
Figure 19:
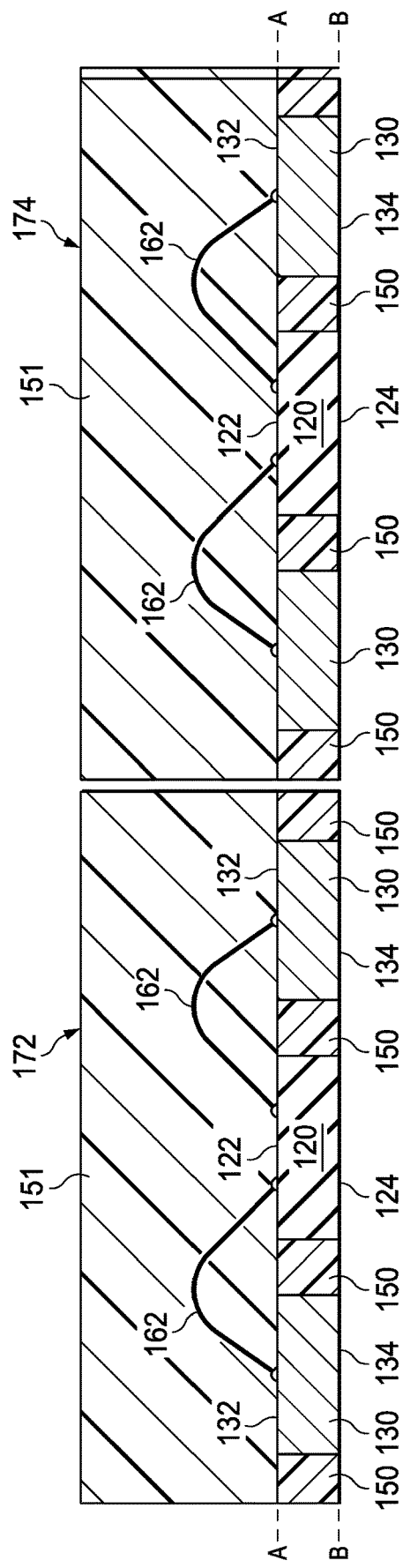
FIG. 19 is a cross-sectional elevation view showing the assembly of FIGS. 17 and 18 after being diced into two QFN packages.
Figure 22:
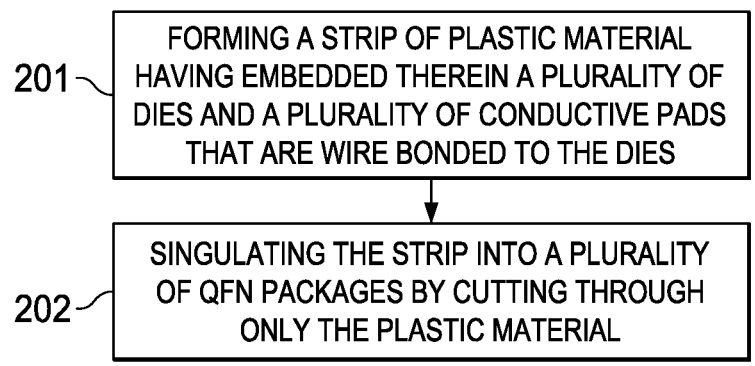
FIG. 22 is a flow chart of a method of producing a plurality of QFN packages.

This specification, in general, discloses a quad flat no lead ("QFN") package 172, FIG. 19, that includes a die 120 having an active side 122 positioned substantially in a first plane AA and a backside 124 positioned substantially in a second plane BB parallel to the first plane AA. The QFN package 172 also includes a plurality of separate conductive pads 130 each having a first side 132 positioned substantially in the first plane AA and a second side 134 positioned substantially in the second plane BB. Mold compound 150 is positioned between the first and second planes in voids between the conductive pads 130 and the dies 120. Also disclosed, in general, as illustrated in FIG. 22, is a method of producing a plurality of QFN packages. The method includes forming a strip of plastic material having embedded therein a plurality of dies and a plurality of conductive pads that are wire bonded to the dies, e.g., FIG. 18. The method further includes singulating the strip into a plurality of QFN packages by cutting through only the plastic material, e.g., FIG. 19.

Figure 1:
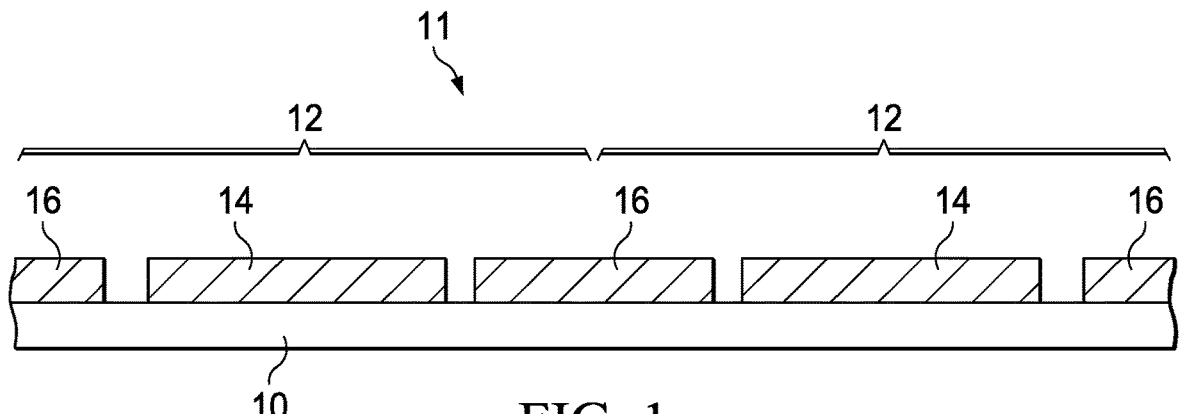
FIGS. 1-7 are schematic cross-sectional elevation views illustrating various stages of a prior art QFN production process.

FIGS. 1-7 illustrate the prior art method of forming QFN packages. FIG. 1 is a cross sectional view of a leadframe strip 11 that is supported on a leadframe support tape 10. The leadframe strip 11 comprises a plurality of interlinked leadframes 12 (only two leadframes 12 are shown in FIG. 1). Each leadframe 12 has a die attach pad 14 surrounded by a plurality of leads 16. Each of the leads 16 of one leadframe 12 is integrally connected to a lead 16 of an adjacent leadframe 12.

Figure 2:
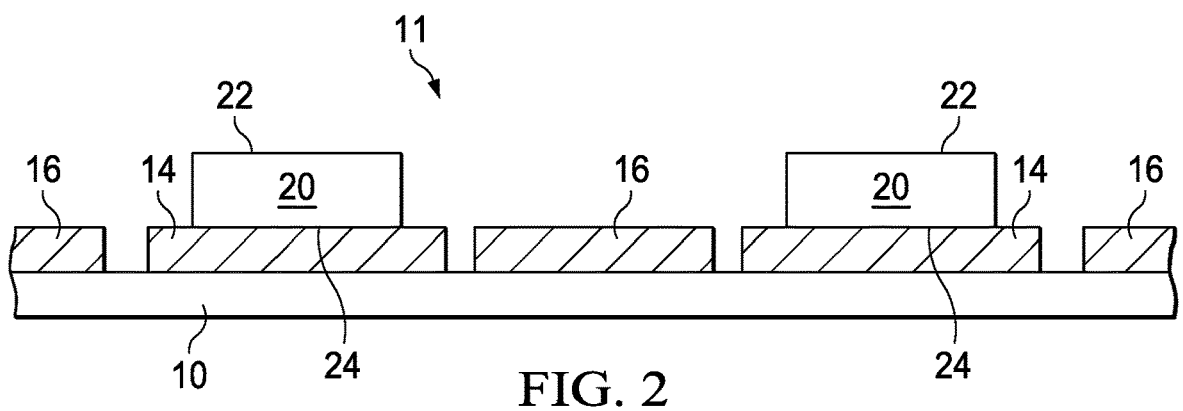

In a die attach process, as illustrated in FIG. 2, dies 20 are attached to the die attach pads 14 of each leadframe 12. Each die 20 has an active or front side 22 and a backside 24. Each die 20 is mounted on a die attach pad 14 with the backside 24 of the die facing down. Each die 20 is attached to the associated die attached pad 14 with an attachment layer (not shown) such as solder or epoxy.

Figure 3:
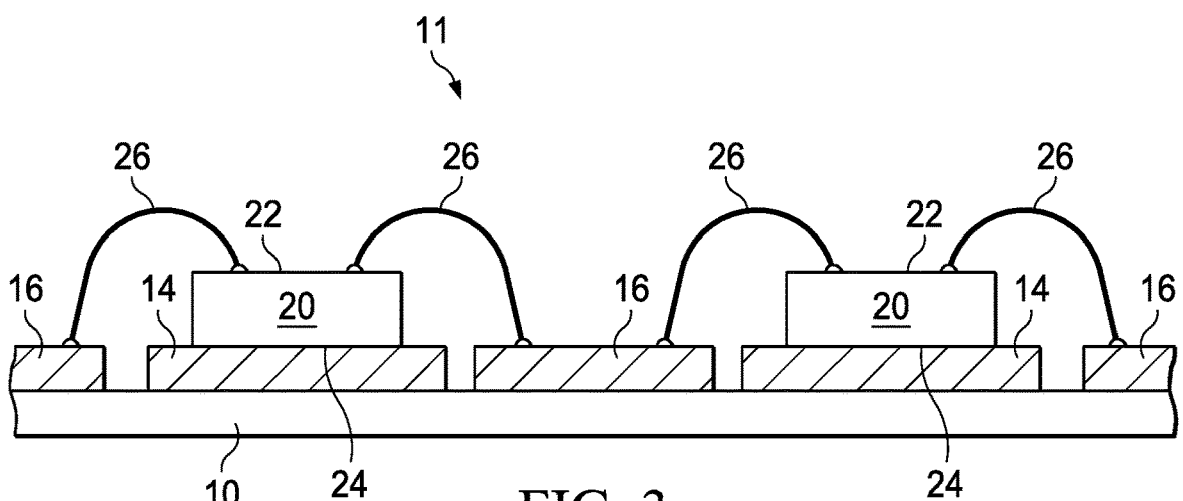
Figure 4:
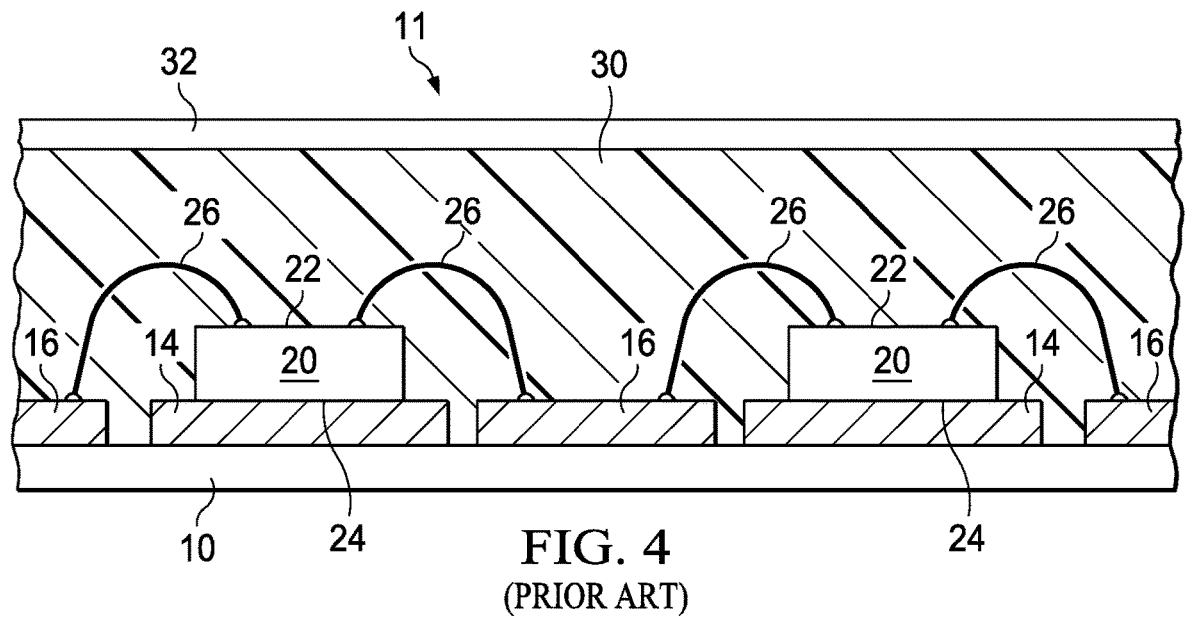

Next, as illustrated in FIG. 3, each die 20 is electrically connected to the associated leads 16 by bond wires 26. This assembly is then encapsulated in mold compound 30, using a support film 32, as illustrated in FIG. 4.

Figure 5:
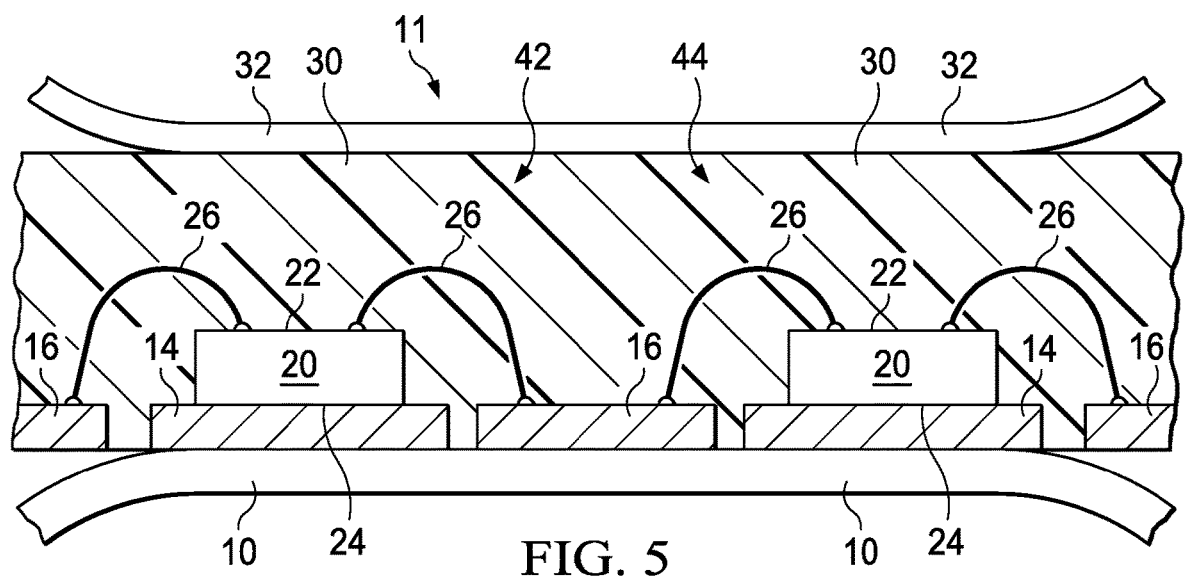
Figure 6:
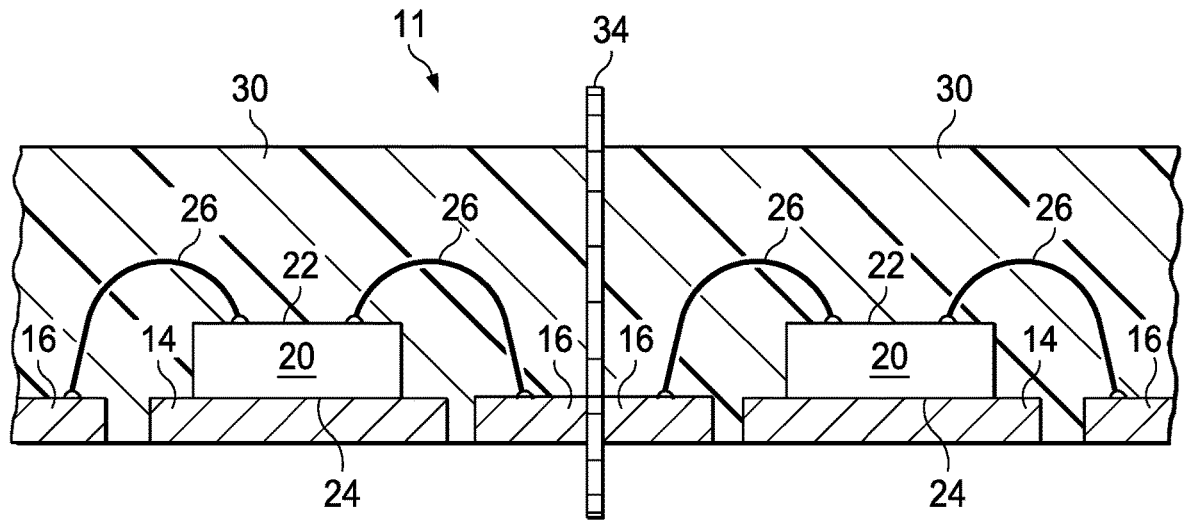

As illustrated in FIG. 5, next, the support tape 10 and support film 32 are removed from the assembly. Then, as illustrated in FIG. 6 the assembly is diced (singulated) with a conventional singulation saw blade 34 or punch or stealth laser (not shown). During singulation, integrally attached leads 16/16 are severed by the cutting blade 34. In another prior art embodiment (not shown) two parallel cuts are made to separate integrally attached leads to thereby remove a central connection portion positioned between adjacent leadframes.

Figure 7:
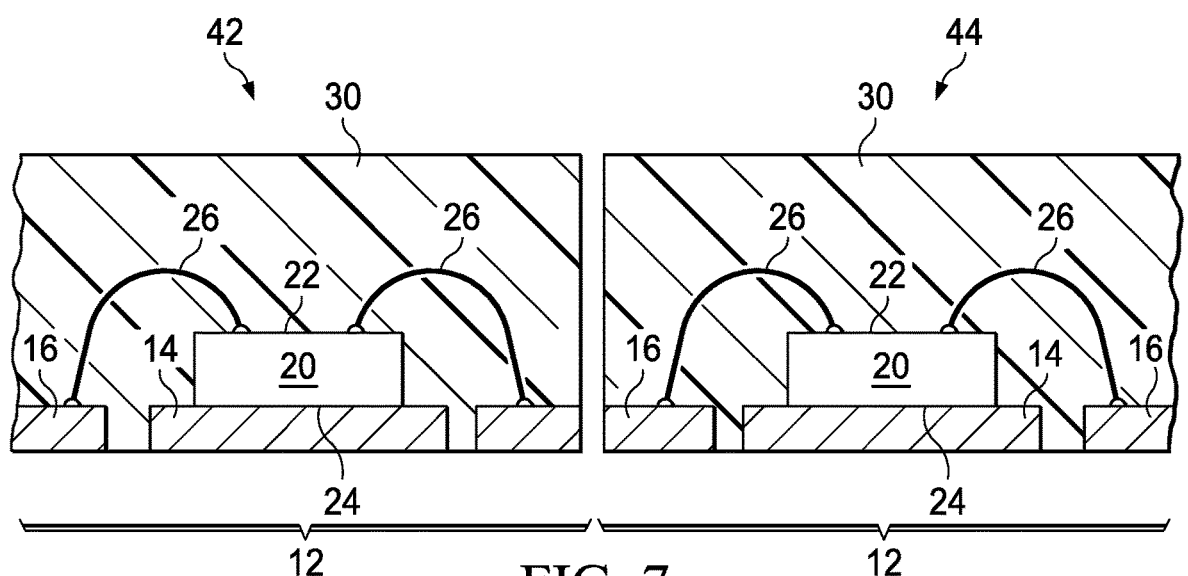

As shown by FIG. 7, singulation creates a plurality of individual QFN packages 42, 44. Each QFN package 42, 44 has a die attach pad 14 and leads 16 of a single leadframe exposed on the bottom surface of the package.

During dicing metal burrs may be generated on the cutting plane of the leadframe. Such burrs are generated not only in the direction in which the blade moves (i.e., the cutting direction), but also in the plate thickness direction (perpendicular to the top and bottom surfaces of the leadframe).

Because the clearance between leads is small in QFN packages, the burrs in the cutting direction may lead to short-circuit problems, such as solder bridges, etc., when leads are assembled on a wiring substrate. Also, because the burrs in the plate thickness direction of the leads protrude from the bottom surface of the package, the planarization (flatness) of the QFN package may be poor, and when it is assembled on a wiring substrate, the connections to the lands of the wiring substrate may also be poor.

Figure 8:
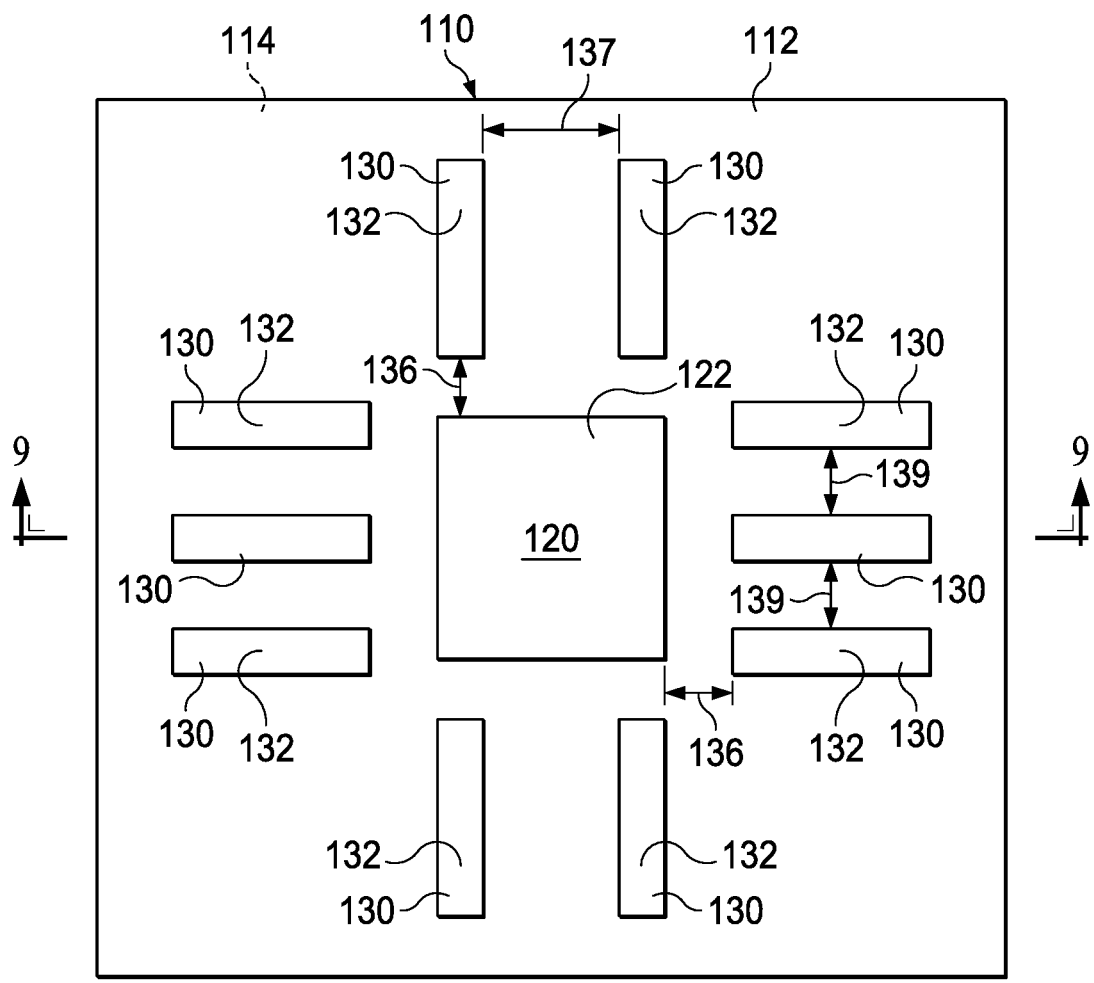
FIG. 8 is a top plan view of a die and conductive pads mounted on a support sheet.
Figure 9:
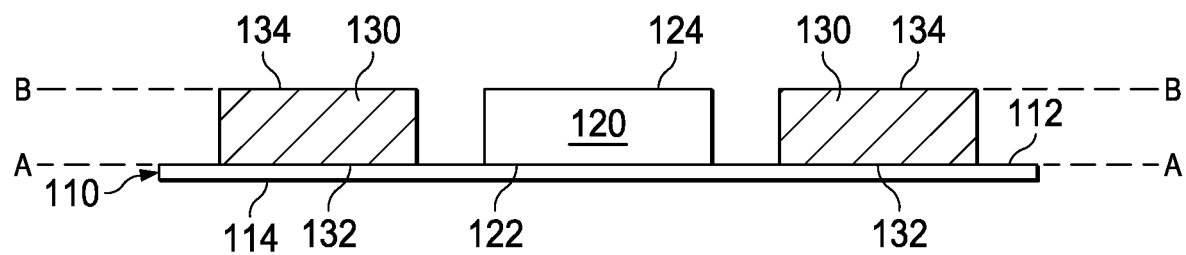
FIG. 9 is a cross-sectional elevation view of the assembly of FIG. 8.

A new method of producing QFN packages is illustrated in FIGS. 8-19. FIGS. 8 and 9 illustrate a support tape 110 having a flat tacky top surface 112 and a smooth (non-tacky) bottom surface 114. An integrated circuit ("IC") die 120 having an active front side surface 122 and a backside surface 124, which is typically metal coated) is mounted active side 122 down, as by a pick-and-place machine, on the tacky top surface 112 of the support tape 110. A plurality of metal conductive pads 130 (sometimes referred to in the art as "contact pads") having a first surface 132 and an opposite second surface 134 are mounted, as by a pick-and-place machine, in encompassing relationship with the die 120, first surface 132 down. Each conductive pad 130 has the same height (thickness) as the die 120. Thus, the active surfaces 122 of the dies 120 and the first surfaces 132 of the conductive pads 130 all lie substantially in the same plane AA and the backside surfaces 124 of the dies 120 and the second surfaces 134 of the conductive pads 130 all lie substantially in a second plane BB parallel to the first plane AA. As shown by FIG. 8, each conductive pad 130 may be spaced at a predetermined distance 136 from the associated die 120, and conductive pads 130 on each side of the associated die 120 may be spaced at a predetermined distance 137 or 139 from an adjacent conductive pad 130.

Figure 10:
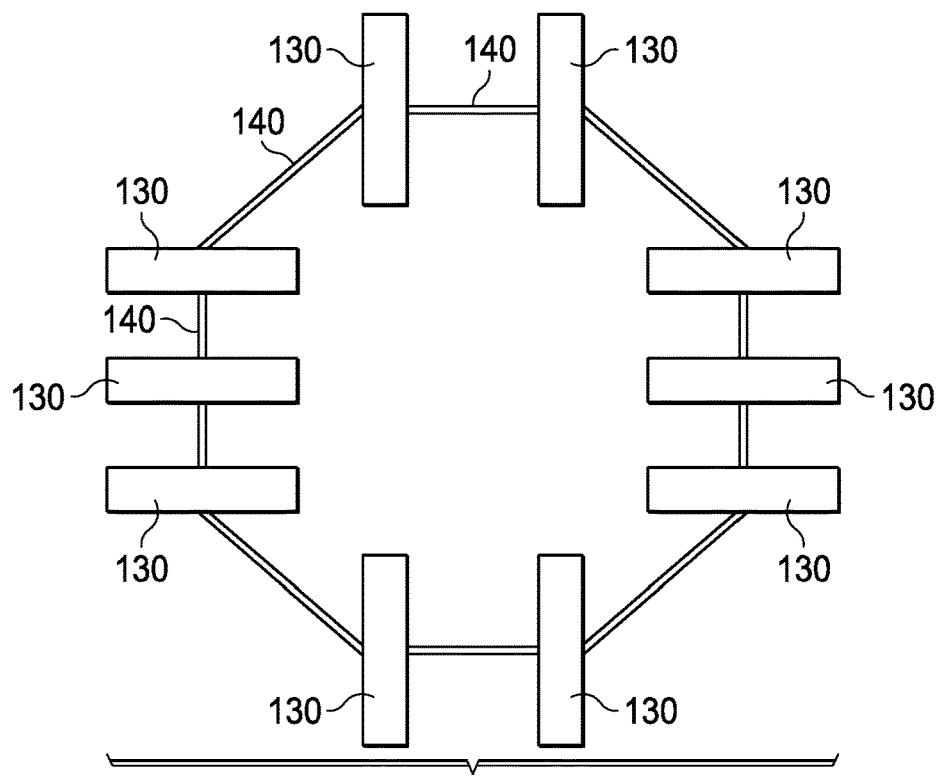
FIG. 10 is a top plan view of another configuration of conductive pads of a QFN package.

The assembly shown in FIGS. 8 and 9 includes only a portion of the support tape 110 and the dies 120 and conductive pads 130 associated with that portion. The entire support tape 110 supports many such die and conductive pad configurations. It is noted that the conductive pads 130 are not portions of a leadframe and are not integrally connected to adjacent conductive pads. In one embodiment, as illustrated in FIG. 8 there is no connection at all between adjacent pads 130 when they are initially mounted on the support tape 110. In another embodiment, as illustrated in FIG. 10, adjacent pads 130 are connected by a nonelectrical material 140, such as an organic material. This connecting material 140 may facilitate mounting of the conductive pads 130 on the support tape 110 at a predetermined spacing distance from each die and at a predetermined spacing distance from adjacent conductive pads 130.

Figure 11:
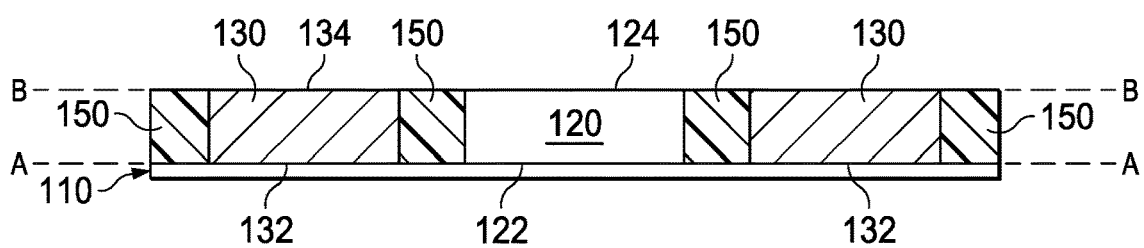
FIG. 11 is a cross-sectional elevation view of the assembly of FIGS. 8 and 9 after application of a first mold encapsulation layer.
Figure 12:
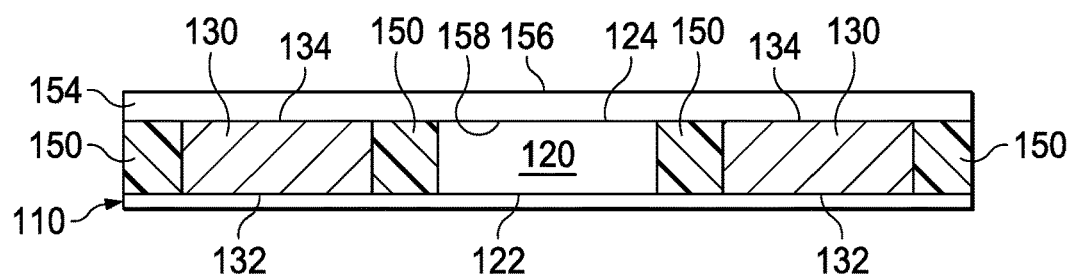
FIG. 12 is a cross-sectional elevation view of the assembly of FIG. 11 after application of a mold release sheet to a top surface thereof.

The next step in the process, as shown by FIG. 11, is to apply a first layer of mold compound 150. The mold compound 150 may be plastic, e.g., epoxy. The mold compound 150 is applied to the support sheet 110 such that it surrounds the attached dies 120 and conductive pads 130. The mold compound 150 may be applied by using a conventional transfer mold. Mold compound 150 is applied to a depth equal to the height of die 120 and the conductive pads 130, i.e., to the height of the second plane BB. The mold compound 150 fills all of the voids between the conductive pads 130 and the dies 120 and all of the voids between conductive pads. As a result the backside surface 124 of each die 120 and the second surface 134 of each conductive pad are exposed, i.e., are not covered with mold compound 150. Then, as shown by FIG. 12, a mold release film or tape 154 having a top surface 156 and a bottom surface 158 is applied to the assembly on the side thereof opposite the support tape 110. This first layer of mold compound 150 is then allowed to cure, causing it to adhere to the die 120 and conductive pads 130 and to hold them apart at their predetermined spacing distances 136, 137, and 139, FIG. 8.

Figure 13:
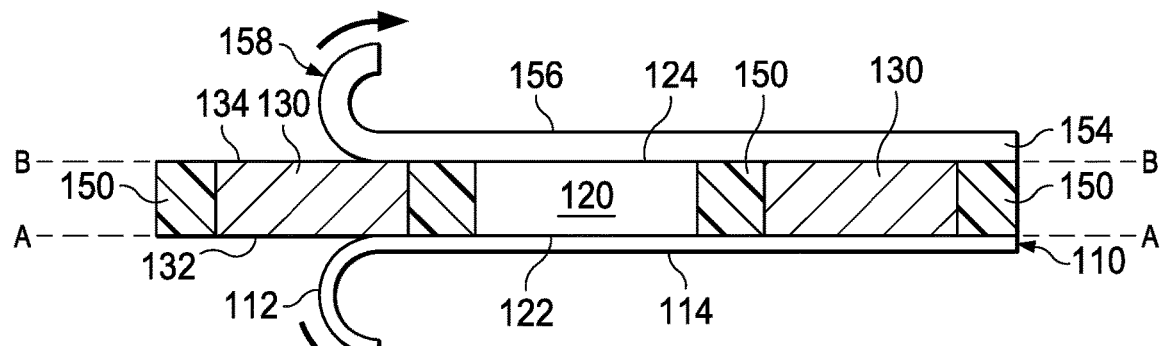
FIG. 13 is a cross-sectional elevation view of the assembly of FIG. 12 with the support sheet and the mold release sheet being removed therefrom.
Figure 14:
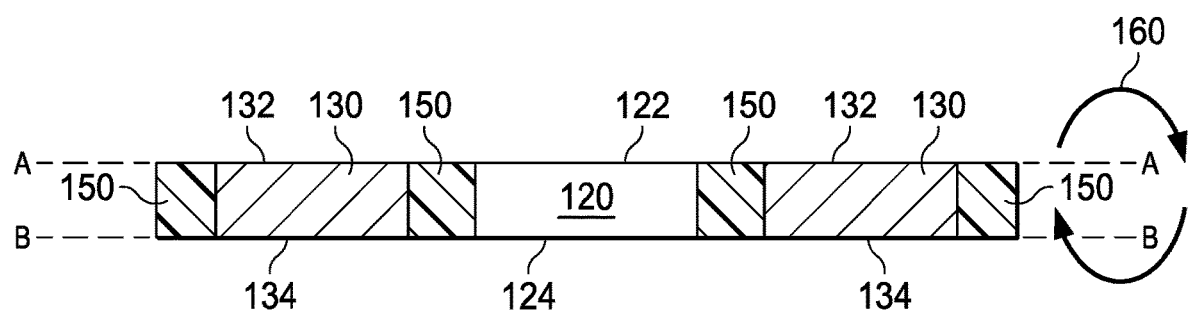
FIG. 14 is a cross-sectional elevation view of the assembly of FIG. 13 with the support sheet and mold release removed therefrom.

The next procedure, as illustrated by FIG. 13, is to remove both the support tape 10 and the mold release tape 154 from the assembly. At this point, as shown by FIG. 13, both the backside surface 124 and the active front side surface 122 of each die 120 are exposed as are both the first and second sides 132, 134 of the conductive pads 130. Next the entire assembly of FIG. 13 is flipped over into the orientation shown in FIG. 14, as indicated by arrows 160. In this orientation shown in FIG. 14, the active front side surface 122 of each die 120 is positioned upwardly and the first surface 132 of each conductive pad 130 is positioned upwardly.

Figure 15:
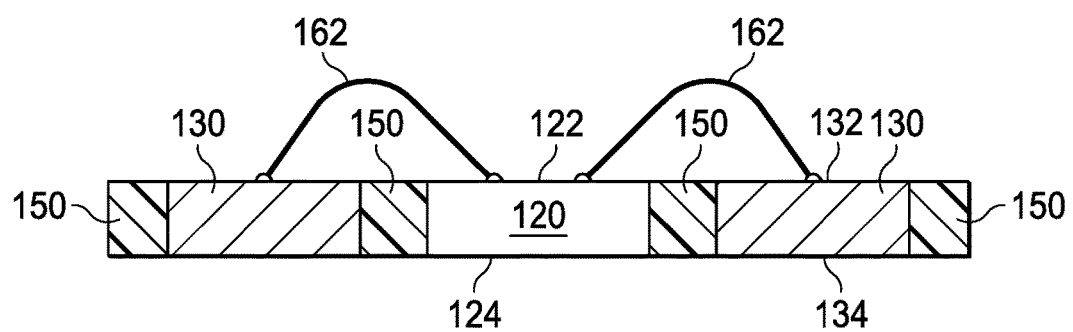
FIG. 15 is a cross-sectional elevation view of the assembly of FIG. 14 in a flipped over position and with bond wires connecting the IC die and two conductive pads.

The next procedure is to electrically connect each die 120 with its associated conductive pads 130. This is done, as shown by FIG. 15, by welding a first end of each of a plurality of bond wires 162 to the active surface 122 of each die and by welding the second end of each of the bond wires 162 to the first surface 132 of each associated conductive pad 130.

Figure 16:
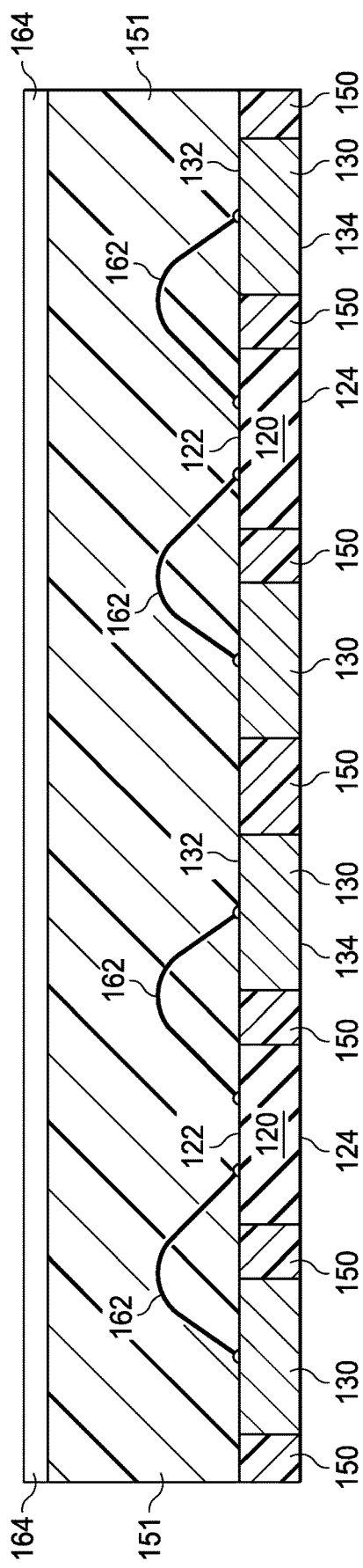
FIG. 16 is an expanded cross-sectional elevation view of the assembly of FIG. 15, that also shows an adjacent die and wire bonded leads, after application of a second mold encapsulation layer and a second mold release sheet to the assembly.

After bonding the dies 120 to associated conductive pads 130 the entire assembly is again molded as shown in FIG. 16. In this second molding operation a second layer of mold compound 151 is applied over the first layer 150 producing a twice molded assembly. A second strip of mold release film 164 is then applied to the top of the twice molded assembly as shown by FIG. 16. The two mold layers 150, 151 bond together due to the heat associated with the second molding operation.

Figure 17:
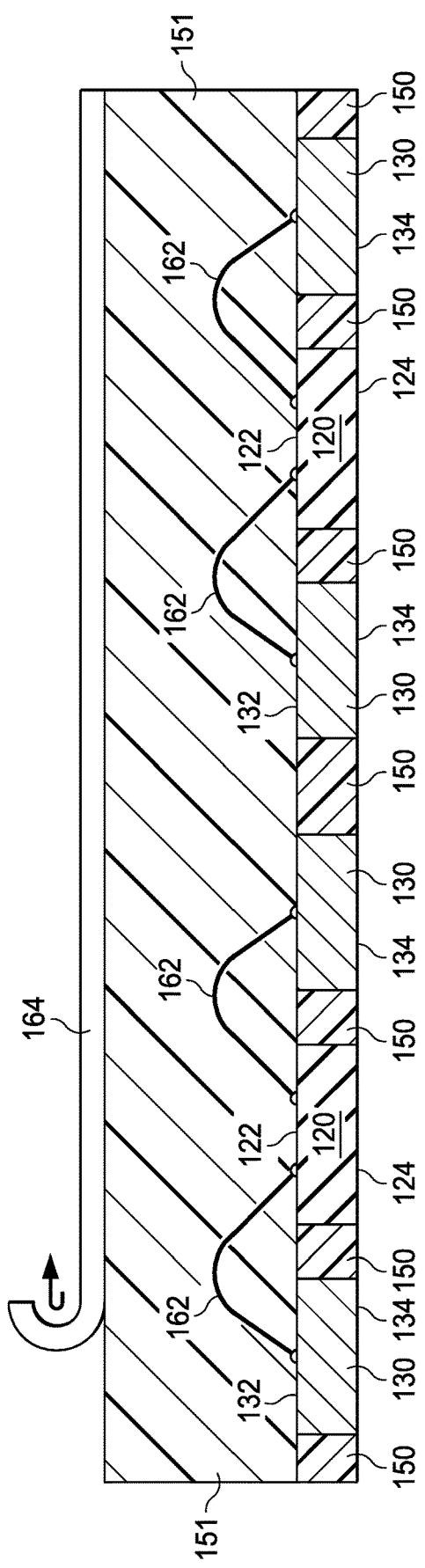
FIG. 17 is a cross-sectional elevation view of the assembly of FIG. 16 showing the mold release sheet being removed therefrom.

The next step, as illustrated by FIG. 17 is to remove the second strip of mold release film, after the mold compound 151 has cured. At this point, if the QFN packages are to be marked with indicia, marking are performed, as with a laser, by printing or by some other means.

Figure 20:
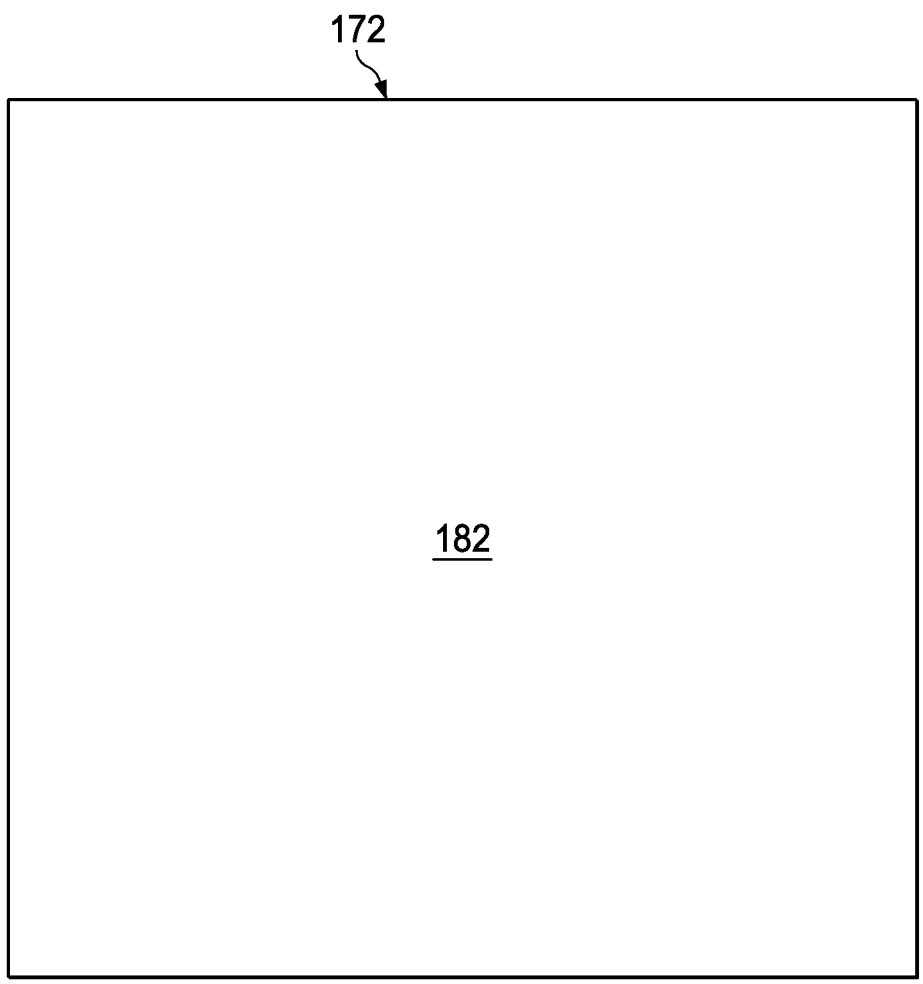
FIG. 20 is a top plan view of one of the QFN packages of FIG. 19.
Figure 21:
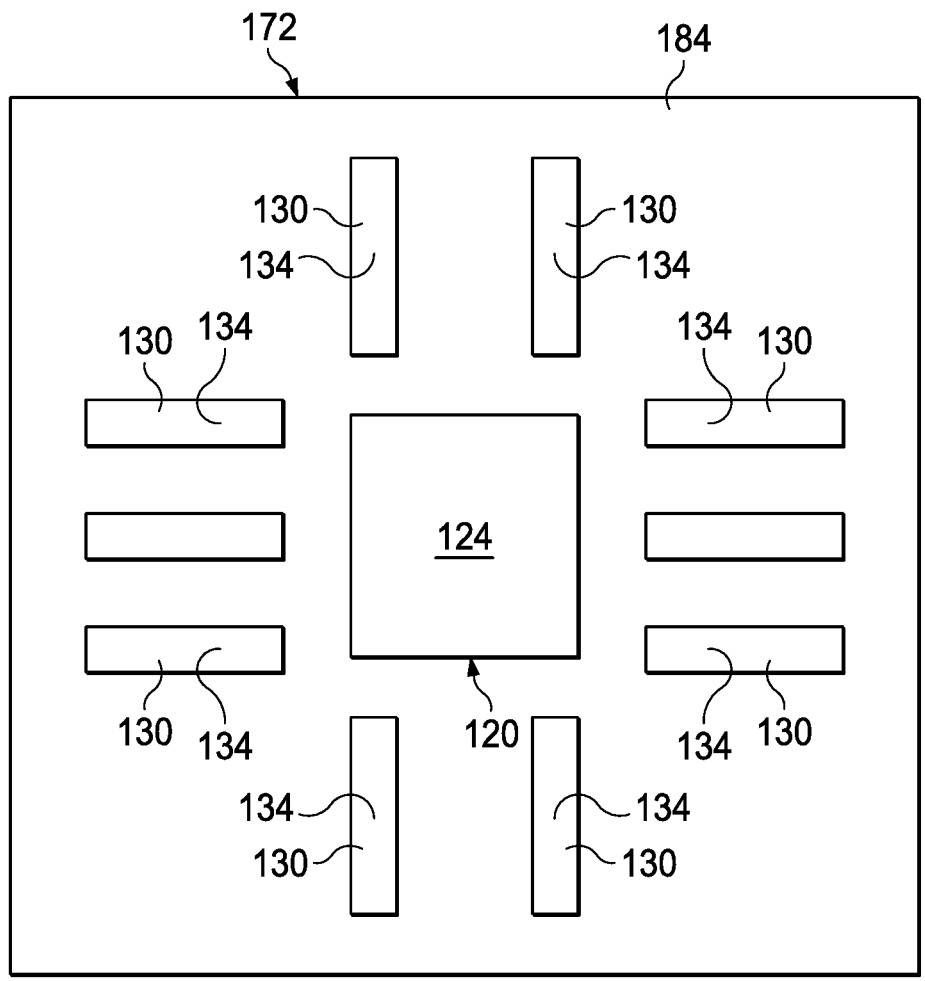
FIG. 21 is a bottom plan view of one of the QFN packages of FIG. 19.

The next step, as illustrated by FIG. 18, is to make a series of singulation cuts with singulation saws 171, 173 to dice the strip 170 into a plurality of IC packages 172 174, etc., as shown by FIG. 19. FIG. 20 is a top plan view of one of the QFN packages 172 and FIG. 21 is a bottom plan view thereof. As illustrated by FIG. 20 the top surface 182 of the package 172 has a generally flat smooth face, which may have a square or rectangular shape. The top surface 182 may have indicia printed thereon (not shown), as previously discussed. As shown by FIG. 21 the bottom face of the QFN package 172 has the second surface 134 of each conductive pad 130 exposed thereon. The metal coated backside surface 124 of the corresponding die 120 is also exposed.

Although certain specific embodiments of a QFN package and method of producing a QFN package have been expressly described herein, it will be obvious to those skilled in the art, after reading this disclosure, that the various inventive concepts disclosed herein may be otherwise embodied. The appended claims are intended to be construed broadly to encompass such alternative embodiments, except to the extent limited by the prior art.

What is claimed is:

1. A method of manufacturing a plurality of QFN packages comprising:
attaching a first side of a plurality of dies and a first side of a plurality of conductive pads to one side of a support film sheet, the plurality of dies having substantially the same thickness as the plurality of conductive pads;

forming a strip of plastic material having embedded therein the plurality of dies and the plurality of conductive pads that are wire bonded to the dies; and singulating the strip into a plurality of QFN packages by cutting through only the plastic material.

2. The method of claim 1, said forming a strip of plastic material further comprising filling voids between the plurality of dies and the plurality of conductive pads with mold compound while leaving a side of each of the plurality of dies and each of the plurality of conductive pads positioned remotely from the support sheet exposed.

3. The method of claim 2, said forming a strip of plastic material further comprising removing the support film sheet to provide a strip of mold compound having a first side on which the first side of each die and the first side of each conductive pad are exposed and a second side on which the second side of each die and the second side of each conductive pad are exposed.

4. The method of claim 3, said forming a strip of plastic material further comprising wire bonding an active side of each die to one side of each of the plurality of conductive pads.

5. The method of claim 4, said forming a strip of plastic material further comprising covering the side of the strip of mold compound having the wire bonds with a second layer of mold compound to form a twice molded assembly.

6. The method of claim 1, wherein the support film sheet is removed prior to the singulating.

7. The method of claim 1, wherein there is no connection at all between adjacent pads when they are initially mounted on the support tape.

8. The method of claim 1, wherein the adjacent pads are connected together by a nonelectrical material.

9. The method of claim 8, wherein the nonelectical material is organic.

10. The method of claim 2, wherein the mold compound is applied to a depth equal to the height of the height of the dies and the conductive pads.

11. The method of claim 3, wherein the plastic material is allowed to cure prior to the support film sheet being removed.

12. A method of manufacturing a plurality of QFN packages comprising:

attaching a first side of a plurality of dies and a first side of a plurality of conductive pads to one side of a support tape, the plurality of dies having substantially the same thickness as the plurality of conductive pads;

applying a first mold compound such that it surrounds the plurality of dies and the plurality of conductive pads;

removing the support tape and wire bonding the conductive pads to the dies;

applying a second mold compound on the first mold compound sufficient to cover the wire bonds, the first and second mold compounds forming a mold compound strip; and singulating the strip into a plurality of QFN packages by cutting through only the first and second mold compounds.

13. The method of claim 12, wherein there is no connection at all between adjacent pads when they are initially mounted on the support tape.

14. The method of claim 12, wherein the adjacent pads are connected together by a nonelectrical material.

15. The method of claim 14, wherein the nonelectical material is organic.

16. The method of claim 2, wherein the first mold compound is applied to a depth equal to the height of the height of the dies and the conductive pads.

17. The method of claim 12, wherein the first mold compound is allowed to cure prior to the support film sheet being removed.

18. A method of manufacturing a plurality of QFN packages comprising:

attaching a first side of a plurality of dies and a first side of a plurality of conductive pads to one side of a support tape, the plurality of dies having substantially the same thickness as the plurality of conductive pads;

applying a first mold compound such that it surrounds, and is applied to substantially the same thickness as, the plurality of dies and the plurality of conductive pads;

allowing the first mold compound to cure;

applying a second mold compound on the first mold compound; and singulating the strip into a plurality of QFN packages by cutting through only the first and second mold compounds.

19. The method of claim 18, wherein the plurality of conductive pads are wire bonded to the dies.

20. The method of claim 18, wherein there is no connection at all between adjacent pads when they are initially mounted on the support tape.

\* \* \* \* \*